(12) United States Patent
Tanaka et al.

(10) Patent No.: US 8,424,764 B2
(45) Date of Patent: Apr. 23, 2013

(54) PHOTOELECTRIC CONVERSION DEVICE, METHOD FOR DRIVING PHOTOELECTRIC CONVERSION DEVICE, RADIATION IMAGING DEVICE, AND METHOD FOR DRIVING RADIATION IMAGING DEVICE

(75) Inventors: Tsutomu Tanaka, Kanagawa (JP); Michiru Senda, Aichi (JP)

(73) Assignee: Sony Corporation, Tokyo (JP)

( * ) Notice: Subject to any disclaimer, the term of this patent is extended or adjusted under 35 U.S.C. 154(b) by 362 days.

(21) Appl. No.: 12/790,899

(22) Filed: May 31, 2010

(65) Prior Publication Data
US 2010/0328478 A1      Dec. 30, 2010

(30) Foreign Application Priority Data

Jun. 26, 2009 (JP) ................. 2009-151845

(51) Int. Cl.
*G06K 7/08* (2006.01)

(52) U.S. Cl.
USPC .................. 235/451; 250/200; 250/371

(58) Field of Classification Search .......... 250/200, 250/336.1, 370.01, 370.08, 370.14, 371; 235/451
See application file for complete search history.

(56) References Cited

U.S. PATENT DOCUMENTS

| | | | | |
|---|---|---|---|---|
| 6,144,466 A | * | 11/2000 | Mizutani et al. | 358/482 |
| 6,600,160 B2 | | 7/2003 | Kobaayashi et al. | |
| 2002/0163491 A1 | * | 11/2002 | Yoshimura et al. | 345/90 |

FOREIGN PATENT DOCUMENTS

| | | |
|---|---|---|
| JP | 11-307756 | 11/1999 |
| JP | HEI 11 307756 | 11/1999 |
| JP | 2000-295134 | 10/2000 |
| JP | 2006-319275 | 11/2006 |

* cited by examiner

*Primary Examiner* — Kristy A Haupt
(74) *Attorney, Agent, or Firm* — Robert J. Depke; The Chicago Technology Law Group, LLC

(57) ABSTRACT

Disclosed herein is a photoelectric conversion device having unit pixels arranged in a matrix, each of the unit pixels including: a photoelectric conversion element; a source follower readout transistor configured to receive a signal charge arising from photoelectric conversion by the photoelectric conversion element by a gate, and read out an electrical signal dependent on the signal charge; and a correction circuit configured to reset gate potential of the readout transistor to Vref+Vth prior to signal readout by the readout transistor, if a reference potential given to the gate of the readout transistor is defined as Vref and threshold voltage of the readout transistor is defined as Vth.

11 Claims, 12 Drawing Sheets

PHOTOELECTRIC CONVERSION DEVICE, METHOD FOR DRIVING PHOTOELECTRIC CONVERSION DEVICE, RADIATION IMAGING DEVICE, AND METHOD FOR DRIVING RADIATION IMAGING DEVICE

The present application claims priority to Japanese Patent Application No. JP 2009-151845 filed in the Japanese Patent Office on Jun. 26, 2009, the entire content of which is hereby incorporated by reference.

BACKGROUND OF THE INVENTION

1. Field of the Invention

The present invention relates to a photoelectric conversion device, a method for driving a photoelectric conversion device, a radiation imaging device, and a method for driving a radiation imaging device. The radiation imaging device is a radiation reading device that performs wavelength conversion of radiation typified by $\alpha$-rays, $\beta$-rays, $\gamma$-rays, and X-rays into the sensitivity range of the photoelectric conversion device by a wavelength converter, and reads information based on the radiation.

2. Description of the Related Art

In the photoelectric conversion device and the radiation imaging device, a charge based on input information arising from photoelectric conversion by a photoelectric converter is transferred to external capacitance, and is converted to a signal voltage by the external capacitance. By transferring a charge from the capacitance of the photoelectric converter itself to the external capacitance and converting it to a signal voltage in this manner, a comparatively-high S/N ratio can be obtained.

In the case of employing a configuration in which plural pixels are arranged in rows, parasitic capacitance is often formed because the line length of a signal line to which a signal is read out from the pixels increases depending on the number of pixels. For example, suppose that 2000×2000 (vertically×horizontally) pixels each having a size of 200 μm×200 μm are arranged to fabricate an area sensor having a size equivalent to that of an X-ray film, e.g. a size of 40 cm×40 cm.

In the case of the area sensor having a size equivalent to that of an X-ray film, capacitance is formed by overlapping between the gate electrode of the transistor for charge transfer and the source region thereof. This overlapping depends on the number of pixels. Therefore, even when the capacitance Cgs by the overlapping is about 0.05 pF per one place, capacitance of 0.05 pF×2000=100 pF is formed in one signal line.

The capacitance Cs of the photoelectric converter itself (sensor capacitance) is about 1 pF. Thus, if the signal voltage generated in the pixel is defined as V1, the output voltage V0 of the signal line is represented by the following equation:

$$V0 = \{Cs/(Cs+Cgs \times 1000)\} \times V1$$

Therefore, the output voltage becomes about 1/100. That is, the output voltage is decreased to a large extent if an area sensor having a large area is formed.

Furthermore, to read a moving image under such circumstances, such sensitivity and high-speed operation performance as to enable reading of 30 or more pictures per one second are further required. It is also required that the dose of X-ray irradiation is as low as possible in e.g. a nondestructive test including X-ray diagnosis in a medical scene particularly. Therefore, increase in the amount of signal charge by a factor of 100 to 400, i.e. further enhancement in the sensitivity, is desired.

On the other hand, as a related art, there has been employed a configuration including, in each pixel, a source follower circuit that has a field effect transistor for receiving a signal charge generated in a photoelectric converter by its gate and reads out a signal voltage dependent on the signal charge to a signal line by this field effect transistor (refer to e.g. Japanese Patent Laid-open No. Hei 11-307756 (hereinafter Patent Document 1, refer to paragraphs 0038 and 0039 and so on particularly)). This source follower circuit enables high-speed signal readout even if the capacitance formed in the signal line is high.

However, the source follower circuit has a problem that variation in its offset potential appears as fixed pattern noise. In particular, in the source follower circuit whose semiconductor layer is composed of amorphous silicon or polycrystalline silicon, the variation in the offset potential is as very large as about 1 V.

FIG. 13 shows a related-art pixel circuit including the source follower circuit. A unit pixel 100 of the related-art example includes a photoelectric conversion element 101, a reset transistor 102, a readout transistor 103, and a row selection transistor 104.

The photoelectric conversion element 101 has the anode connected to an accumulation node N and generates a signal charge dependent on incident light. A capacitive component 105 exists at the accumulation node N, and the signal charge generated in the photoelectric conversion element 101 is accumulated in the accumulation node N. The reset transistor 102 is connected between the accumulation node N and a reference potential Vref, and resets the accumulation node N in response to a reset signal Vrst.

The gate of the readout transistor 103 is connected to the accumulation node N, and the drain thereof is connected to a power supply VDD. The readout transistor 103 receives the signal charge generated in the photoelectric conversion element 101 by its gate and outputs a signal voltage dependent on the signal charge. The row selection transistor 104 is connected between the source of the readout transistor 103 and a signal line 110, and outputs a signal output from the readout transistor 103 to the signal line 110 in response to a row scan signal Vread.

A constant current source 120 is connected to one end of the signal line 110. In this configuration, a source follower circuit is formed by the readout transistor 103 and the constant current source 120 connected to the source of the readout transistor 103 via the row selection transistor 104 and the signal line 110. The signal read out to the signal line 110 by the readout transistor 103 is output via an amplifier 130.

In the pixel circuit having the above-described configuration, the source potential of the readout transistor 103 included in the source follower circuit is lower than the gate input potential by the potential equivalent to the threshold voltage Vth of the readout transistor 103. Due to this lowering, variation in the offset value equivalent to the threshold voltage possessed by the source follower circuit, i.e. variation in the threshold voltage Vth of the readout transistor 103, appears as fixed pattern noise.

To address this problem, in the related art described in Patent Document 1, the output data of each pixel obtained without X-ray irradiation is stored in a memory as the offset value, and the offset value is subtracted from the output data obtained with X-ray irradiation. Thereby, variation in the offset value of the source follower circuit is corrected.

SUMMARY OF THE INVENTION

However, the related art described in Patent Document 1 has a problem that a high-capacity memory is needed and the cost of a signal processing IC including this memory increases because the offset value of each of the pixels in the entire pixel area needs to be stored in the memory for use.

Furthermore, these offset values do not take the same value every time because they are affected by the use temperature of the radiation imaging device, the signal values attributed to the previous radiation irradiation, aging deterioration accompanying use for a long period, and so forth. Therefore, the offset values have to be read out and used every time imaging is performed, which causes the lowering of the processing speed of signal processing. Thus, this technique is an obstacle when high-speed imaging (photographing) or the like is performed.

There is a desire for the present invention to provide a photoelectric conversion device, a method for driving the same, a radiation imaging device, and a method for driving the same capable of correcting variation in the offset value equivalent to the threshold voltage possessed by a source follower circuit without storing the offset value of each of the pixels in the entire pixel area in a memory.

According to an embodiment of the present invention, there is provided a photoelectric conversion device having unit pixels arranged in a matrix, each of the unit pixels including: a photoelectric conversion element; a source follower readout transistor configured to receive a signal charge arising from photoelectric conversion by the photoelectric conversion element by a gate, and read out an electrical signal dependent on the signal charge; and a correction circuit configured to reset gate potential of the readout transistor to Vref+Vth prior to signal readout by the readout transistor, if a reference potential given to the gate of the readout transistor is defined as Vref and threshold voltage of the readout transistor is defined as Vth.

Furthermore, a radiation imaging device can be formed by using a radiation detector that is sensitive to incident radiation and generates a signal charge instead of the photoelectric conversion element.

In the photoelectric conversion device or the radiation imaging device having the above-described configuration, the gate potential of the readout transistor is reset to Vref+Vth prior to signal readout by reset operation by a correction circuit provided in each unit pixel. Thereby, after the reset operation by the correction circuit, the signal charge is accumulated in an accumulation node connected to the gate of the readout transistor in the state in which the offset value equivalent to the threshold voltage Vth of the readout transistor is superimposed on the signal charge. Thus, in signal readout, the offset value equivalent to the threshold voltage Vth, included in the gate input potential, is cancelled out by the threshold voltage Vth of the readout transistor. As a result, the offset value equivalent to the threshold voltage Vth of the readout transistor is not included in the output potential at the time of the signal readout, and therefore the occurrence of fixed pattern noise attributed to variation in the offset value can be suppressed.

According to the present invention, the correction circuit for correcting variation in the offset value equivalent to the threshold voltage Vth possessed by the source follower circuit is provided in each unit pixel, and thereby the variation in the offset value can be corrected without storing the offset value of each of the pixels in the entire pixel area in a memory.

DETAILED DESCRIPTION OF THE PREFERRED EMBODIMENTS

Modes (hereinafter, referred to as the "embodiments") for carrying out the present invention will be described in detail below with use of the drawings. The description will be made in the following order.
1. Photoelectric Conversion Device to which Embodiment of the Present Invention is Applied
2. Features of Embodiment of the Present Invention
  2-1. Embodiment example 1 (Example with One-Stage Reset Operation)
  2-2. Embodiment Example 2 (Example with Two-Stage Reset Operation)
  2-3. Radiation Detector
  2-4. Radiation Imaging Device
3. Modification Examples <1. Photoelectric Conversion Device to which Embodiment of the Present Invention is Applied>
(System Configuration)

Figure 1:
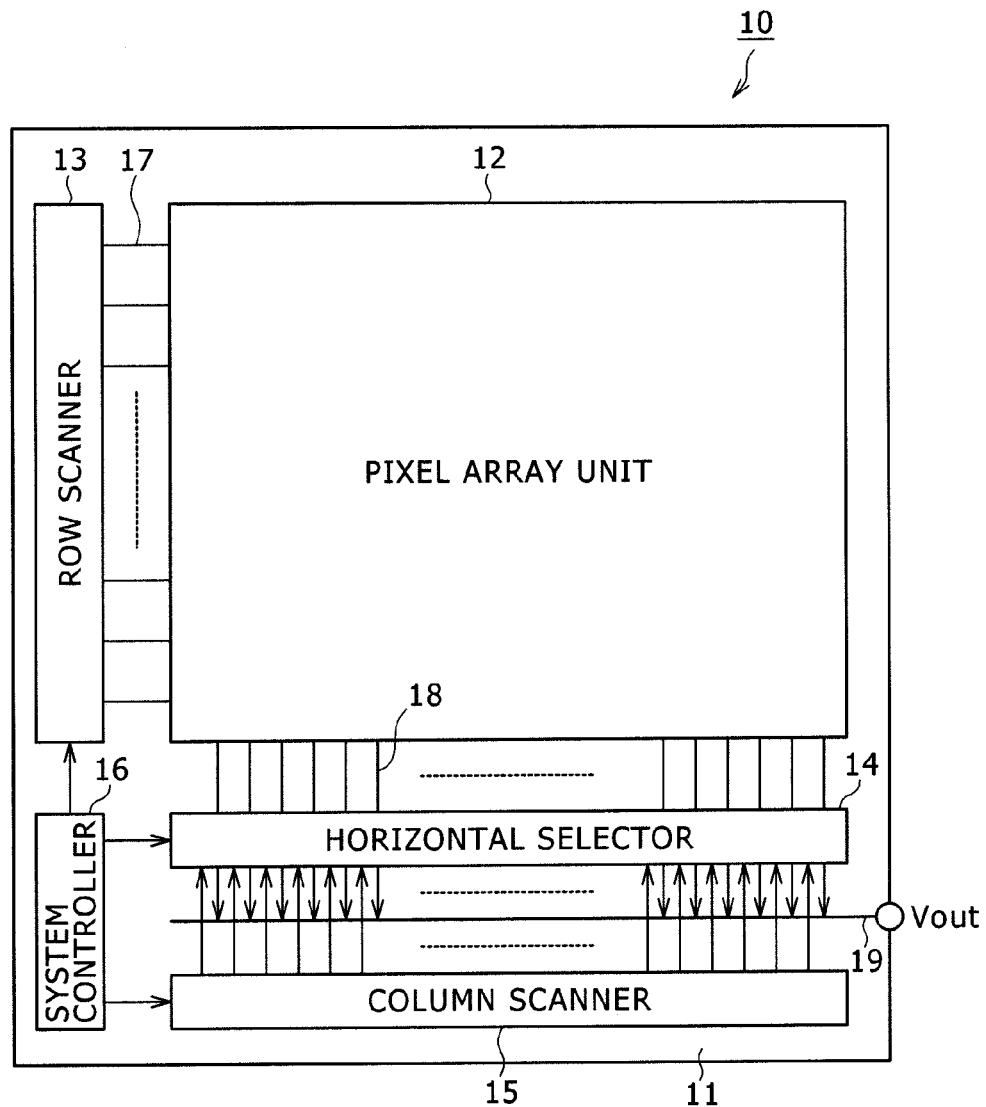
FIG. 1 is a system configuration diagram schematically showing the system configuration of a photoelectric conversion device to which an embodiment of the present invention is applied.

FIG. 1 is a system configuration diagram schematically showing the system configuration of a photoelectric conversion device to which the embodiment of the present invention is applied.

A photoelectric conversion device 10 according to the present application example includes a pixel array unit 12 formed on an insulating substrate 11 such as a glass substrate (hereinafter, it will be often referred to simply as the "substrate") and a peripheral circuit unit integrated on the same substrate 11 as that of the pixel array unit 12. In this example, as the peripheral circuit unit, e.g. a row scanner (vertical driver) 13, a horizontal selector 14, a column scanner (horizontal driver) 15, and a system controller 16 are provided.

In the pixel array unit 12, unit pixels (hereinafter, the unit pixel will be often referred to simply as the "pixel") are two-dimensionally arranged in a matrix. Each of the unit pixels has a photoelectric converter (photoelectric conversion element) that generates a photocharge with the amount of charge dependent on the amount of incident light and accumulates the photocharge inside. The specific configuration of the unit pixel will be described later.

Furthermore, in the pixel array unit 12, corresponding to the matrix pixel arrangement, pixel drive lines 17 are provided for each pixel row along the row direction (the alignment direction of the pixels on the pixel row), and vertical signal lines 18 are provided for each pixel column along the column direction (the alignment direction of the pixels on the pixel column). The pixel drive line 17 transmits a drive signal for driving to read out a signal from the pixel. In FIG. 1, the pixel drive line 17 is shown as one line per one pixel row. However, the number of lines as the pixel drive line 17 per one pixel row is not limited to one. One end of each of the pixel drive lines 17 is connected to the output terminal of the row scanner 13 corresponding to a respective one of the rows.

The row scanner 13 is a pixel driver that is composed of a shift register, an address decoder, etc. and drives the respective pixels in the pixel array unit 12 e.g. on a row-by-row basis. The signals output from the respective unit pixels on the pixel row selectively scanned by the row scanner 13 are supplied to the horizontal selector 14 via the respective vertical signal lines 18. The horizontal selector 14 is composed of an amplifier, a horizontal selection switch, etc. provided for each of the vertical signal lines 18.

The column scanner 15 is composed of a shift register, an address decoder, etc. and scans the respective horizontal selection switches in the horizontal selector 14 to drive them in turn. By the selective scanning by this column scanner 15, the signals of the respective pixels transmitted via the respective vertical signal lines 18 are output to a horizontal signal line 19 in turn and transmitted to the external of the substrate 11 via this horizontal signal line 19.

The circuit part composed of the horizontal selector 14, the column scanner 15, and the horizontal signal line 19 is formed by using a circuit formed on the insulating substrate 11 such as a glass substrate, or an external control IC, or both of them.

The system controller 16 receives a clock given from the external of the substrate 11, data for ordering the operating mode, etc. and outputs data of the internal information of this photoelectric conversion device 10 and so on. Furthermore, the system controller 16 has a timing generator for generating various kinds of timing signals and controls driving of the peripheral circuit part such as the row scanner 13, the horizontal selector 14, and the column scanner 15 based on various kinds of timing signals generated by the timing generator.
(Radiation Imaging Device)

Figure 2:
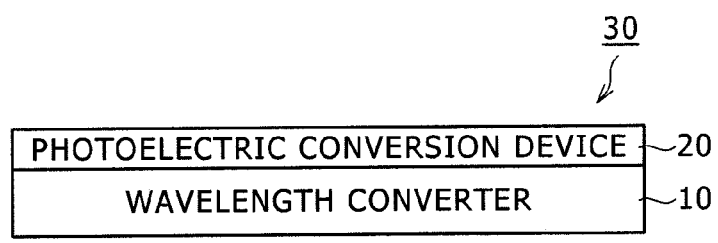
FIG. 2 is a schematic configuration diagram showing a radiation imaging device obtained by combination of the photoelectric conversion device and a wavelength converter.

By combining the photoelectric conversion device 10 having the above-described configuration with a wavelength converter that performs wavelength conversion of radiation typified by α-rays, β-rays, γ-rays, and X-rays into the sensitivity range of the photoelectric conversion device 10, a radiation imaging device (radiation reading device) that reads information based on the radiation can be formed. Specifically, as shown in FIG. 2, a radiation imaging device 30 can be formed by providing a wavelength converter 20 such as a phosphor (e.g. a scintillator) on the light receiving side of the pixel array unit 12 of the photoelectric conversion device 10.

<2. Features of Embodiment of the Present Invention>

The photoelectric conversion device 10 and the radiation imaging device 30 having the above-described configuration according to the embodiment of the present invention have a feature that a correction circuit capable of correcting variation in the offset value equivalent to the threshold voltage possessed by a source follower circuit is provided in each unit pixel.

By providing the correction circuit in each unit pixel in this manner, variation in the offset value can be corrected in each pixel without storing the offset value of each of the pixels in the entire pixel area (the whole of the pixel array unit 12) in a memory, differently from the related art. Thus, more accurate correction of the variation in the offset value equivalent to the threshold voltage possessed by the source follower circuit is possible.

The offset value equivalent to the threshold voltage possessed by the source follower circuit changes every time imaging is performed due to the influence of the use temperature of the radiation imaging device 30, the residual signal values attributed to the previous radiation irradiation, aging deterioration accompanying use for a long period, and so forth. However, this offset value can be completely excluded. Furthermore, because readout of the correction values for every imaging is unnecessary, high-speed photographing such as dynamic photographing of a heart or the like is allowed. As a result, the exposure of the human body to radiation can be reduced.

A description will be made below about specific embodiment examples of the unit pixel having the correction circuit capable of correcting variation in the offset value equivalent to the threshold voltage possessed by the source follower circuit.

[2-1. Embodiment Example 1]
(Pixel Circuit)

Figure 3:
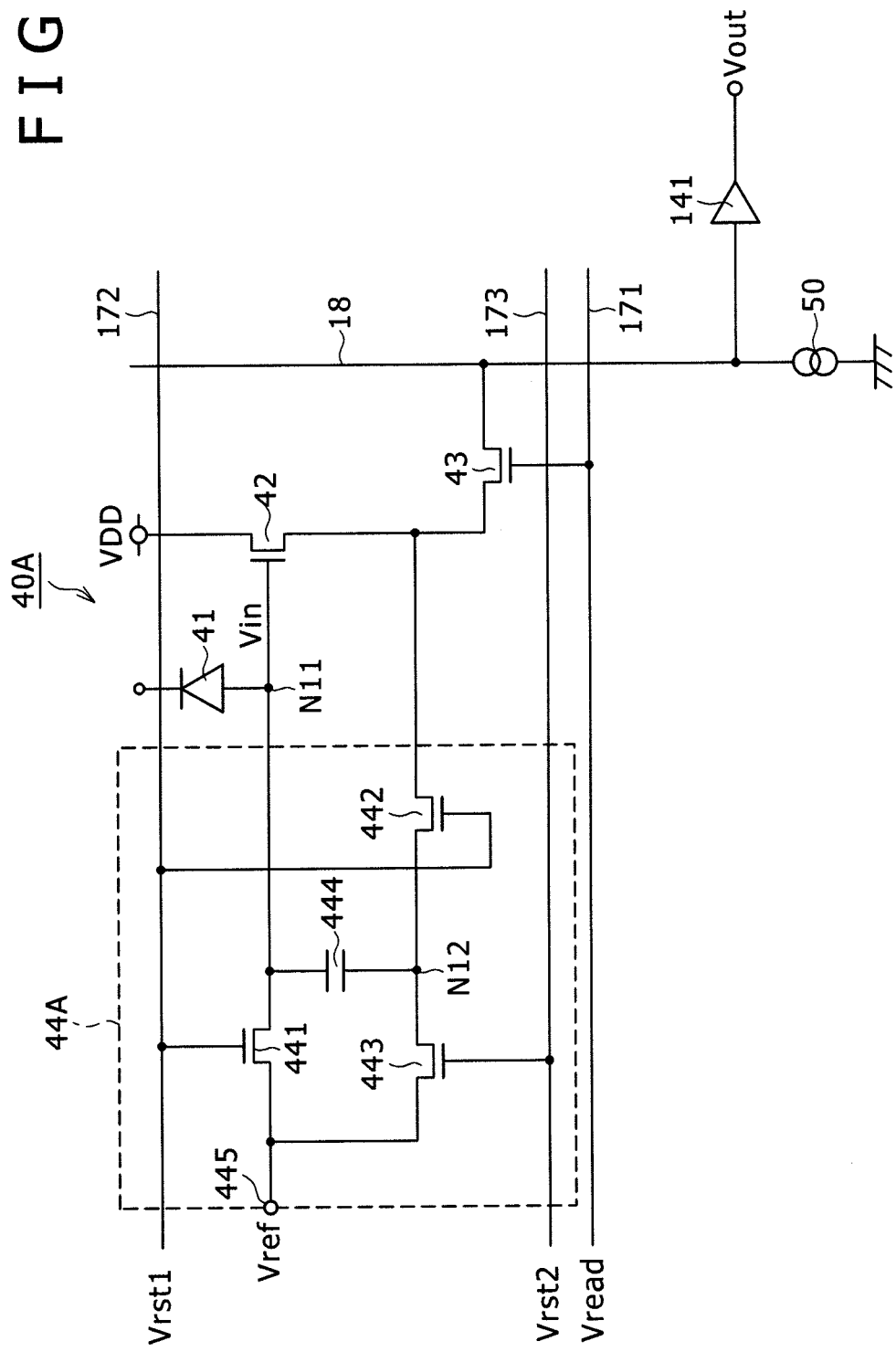
FIG. 3 is a circuit diagram showing the circuit configuration of a unit pixel according to an embodiment example 1.

FIG. 3 is a circuit diagram showing the circuit configuration of the unit pixel according to the embodiment example 1. As shown in FIG. 3, a unit pixel 40A according to the embodiment example 1 includes a photoelectric conversion element 41, a readout transistor 42, a row selection transistor 43, and a correction circuit 44A. For this unit pixel 40A, as the pixel drive line 17, e.g. three lines, specifically a row selection line 171 and first and second reset control lines 172 and 173 are provided for each pixel row.

The photoelectric conversion element 41 is e.g. a positive intrinsic negative (PIN) photodiode. It has the anode connected to an accumulation node N11 and generates a signal charge with the amount of charge dependent on the amount of incident light. The signal charge generated by this photoelectric conversion element 41 is accumulated in the accumulation node N11.

The gate of the readout transistor 42 is connected to the accumulation node N11, and the drain thereof is connected to a power supply VDD. The readout transistor 42 is a source follower transistor that receives the signal charge generated in the photoelectric conversion element 41 by its gate and outputs an electrical signal dependent on the signal charge, i.e. a signal voltage. The semiconductor layer of this readout transistor 42 is composed of e.g. microcrystalline silicon or polycrystalline silicon.

Because the mobility μ of microcrystalline silicon or polycrystalline silicon (poly-silicon) is higher than that of amorphous silicon, high-speed signal readout by the readout transistor 42 is possible. It is known that, when the semiconductor layer of the readout transistor 42 is composed of e.g. low-temperature poly-silicon, variation in the threshold voltage Vth of this readout transistor 42 is about ±0.5 to 1 V.

The row selection transistor 43 is connected between the source of the readout transistor 42 and the vertical signal line 18. It outputs the signal output from the readout transistor 42 to the vertical signal line 18 in response to the row scan signal Vread given from the row scanner 13 via the row selection line 171.

That is, the row selection transistor 43 turns the unit pixel 40A to the selected (activated) state. This row selection transistor 43 can select the unit pixel 40A also when being connected between the drain of the readout transistor 42 and the power supply VDD instead of between the source of the readout transistor 42 and the vertical signal line 18.

A constant current source 50 is connected to one end of the vertical signal line 18. In this configuration, a source follower circuit is formed by the readout transistor 42 and the constant current source 50 connected to the source of the readout transistor 42 via the row selection transistor 43 and the vertical signal line 18. The signal read out to the vertical signal line 18 by the readout transistor 42 is supplied to an amplifier 141 in the horizontal selector 14.

The correction circuit 44A is composed of three reset transistors 441, 442, and 443 serving as the switch element and one capacitor 444. This correction circuit 44A functions to reset the potential of the accumulation node N11 to a potential Vref+Vth, obtained by adding the threshold voltage Vth of the readout transistor 42 to a reference potential Vref, prior to signal readout.

The reset transistor 441 is connected between the accumulation node N11 and a reference potential terminal 445, and carries out on/off operation in response to a reset signal Vrst1 given from the row scanner 13 via the first reset control line 172. The reference potential Vref is given to the reference potential terminal 445.

One electrode of the reset transistor 442 is connected to the source of the readout transistor 42, and the reset transistor 442 carries out on/off operation in response to the reset signal Vrst1 given from the row scanner 13 via the first reset control line 172. That is, the reset transistor 442 carries out the on/off operation in synchronization with the reset transistor 441.

One electrode of the reset transistor 443 is connected to the other electrode of the reset transistor 442, and the other electrode of the reset transistor 443 is connected to the reference potential terminal 445. The reset transistor 443 carries out on/off operation in response to a reset signal Vrst2 given from the row scanner 13 via the second reset control line 173. The capacitor 444 is connected between the accumulation node N11 and a common connection node N12 of the reset transistors 442 and 443.

In this example, e.g. N-channel field effect transistors are used as the readout transistor 42, the row selection transistor 43, and the reset transistors 441 to 443. However, this combination of the conductivity type of the readout transistor 42, the row selection transistor 43, and the reset transistors 441 to 443 is merely one example, and the combination of the conductivity type of these transistors is not limited thereto.

(Circuit Operation)

Figure 4:
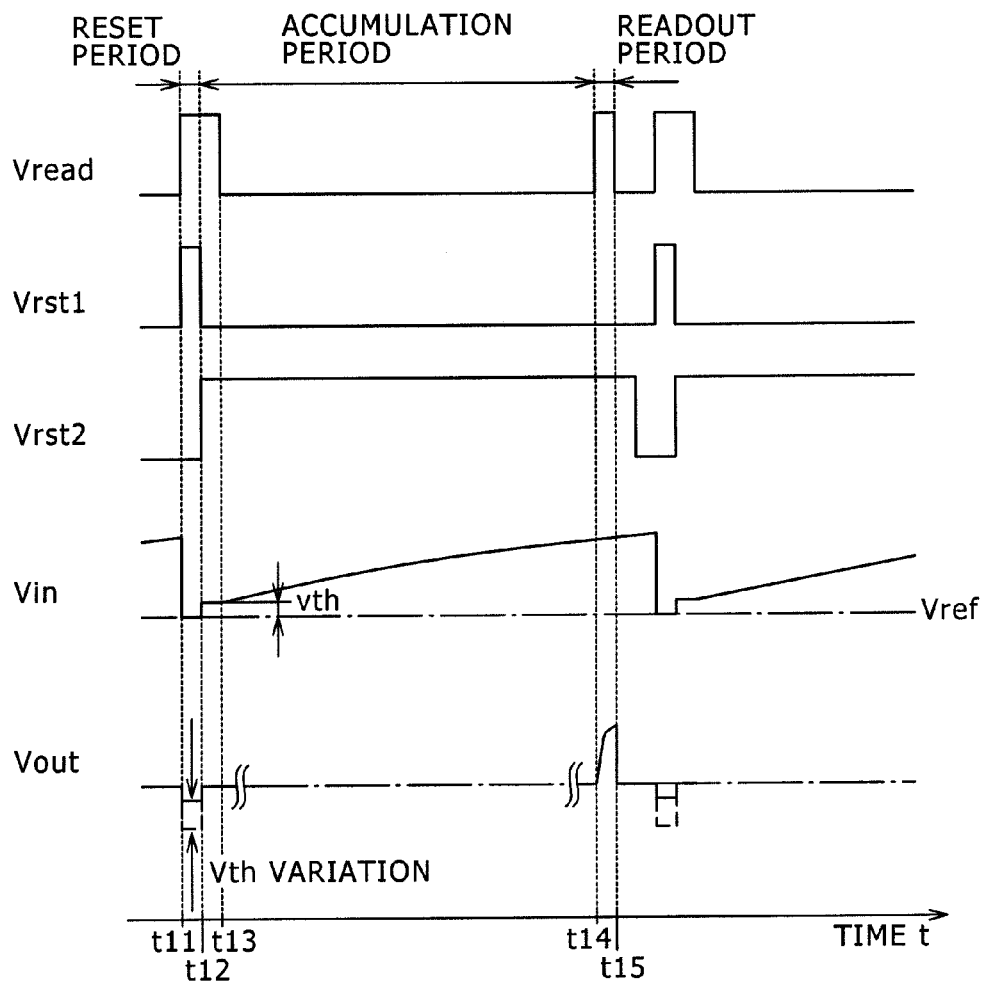
FIG. 4 is a timing chart for explaining the circuit operation of the unit pixel according to the embodiment example 1.

The circuit operation of the unit pixel 40A according to the embodiment example 1 having the above-described configuration will be described below with use of a timing chart of FIG. 4. In the timing chart of FIG. 4, the respective waveforms of the row scan signal Vread, the reset signals Vrst1 and Vrst2, the gate input potential Vin of the readout transistor 42, and the output potential Vout of the amplifier 141 are shown.

At a time t11, the row scan signal Vread becomes the active (in this example, the higher level) state. In response to this, the row selection transistor 43 is turned to the on-state, which leads to the state in which the respective pixels on the pixel row to which the pixel 40A including this row selection transistor 43 belongs are selected.

Simultaneously, at the time t11, the reset signal Vrst1 becomes the active (in this example, the higher level) state, and thereby both the reset transistors 441 and 442 are turned to the on-state. Due to the switching of the reset transistor 441 to the on-state, the potential of the accumulation node N11 is reset to the reference potential Vref, so that the gate input potential Vin of the readout transistor 42 becomes the reference potential Vref.

At this time, the source potential of the readout transistor 42 becomes the potential lower than the gate input potential Vin by the potential equivalent to the threshold voltage Vth of the readout transistor 42, i.e. Vref−Vth. Furthermore, the potential of the common connection node N12 also becomes Vref−Vth because the reset transistor 442 is in the on-state. As a result, the voltage across the capacitor 444 becomes equal to the threshold voltage Vth.

Next, at a time t12, the reset signal Vrst1 becomes the inactivate state, and simultaneously the reset signal Vrst2 becomes the active (in this example, the higher level) state. Thereby, the reset transistor 443 is turned to the on-state, so that the potential of the common connection node N12 becomes the reference potential Vref. As a result, the potential of the accumulation node N11 is shifted from the potential Vref by the potential equivalent to the voltage Vth across the capacitor 444, to become Vref+Vth.

The period from the time t11 to the time t12, in which the above-described series of operation is carried out, serves as a reset period for resetting the potential of the accumulation node N11. By this reset operation, the potential of the accumulation node N11 becomes Vref+Vth. That is, the potential of the accumulation node N11 is reset to Vref+Vth. Thereafter, the row scan signal Vread becomes the inactive state at a time t13.

Upon the end of the reset operation at the time t12, accumulation of the signal charge arising from photoelectric conversion by the photoelectric conversion element 41 in the accumulation node N11 is started. Thereby, the gate input potential Vin of the readout transistor 42 rises up from the reference potential Vref+Vth depending on the amount of charge accumulated in the accumulation node N11.

Specifically, the accumulation of the signal charge in the accumulation node N11 starts in the state in which the offset value equivalent to the threshold voltage Vth of the readout transistor 42 is superimposed on the signal charge due to the reset operation by the reset transistors 441 to 443. As a result, the gate input potential Vin of the readout transistor 42 is obtained as a potential including the offset value equivalent to the threshold voltage Vth.

After the elapse of a certain accumulation period, at a time t14, the row scan signal Vread becomes the active state again. Thereby, the row selection transistor 43 is turned to the on-state, which leads to the state in which the respective pixels on the pixel row to which the pixel 40A including this row selection transistor 43 belongs are selected. The period from the time t12 to the time t14 serves as the accumulation period (photoelectric conversion period).

By the pixel selection, readout of the accumulation voltage by the readout transistor 42 is started. At this time, the offset value included in the gate input potential Vin of the readout transistor 42, i.e. the threshold voltage Vth, is cancelled out by the threshold voltage Vth of the readout transistor 42. Thus, the output potential Vout is not affected by variation in the threshold voltage Vth of the readout transistor 42 in a readout period (t14 to t15) although being affected by the variation in the threshold voltage Vth in the reset period (t11 to t12).

The following operation and effect can be achieved by resetting (setting) the potential of the accumulation node N11, i.e. the gate input potential Vin, to Vref+Vth prior to signal readout by the reset operation by the correction circuit 44A provided in each pixel 40A as described above.

Specifically, after the reset operation by the correction circuit 44A, the signal charge is accumulated in the accumulation node N11 in the state in which the offset value equivalent to the threshold voltage Vth of the readout transistor 42 is superimposed on the signal charge. Thus, in signal readout, the offset value equivalent to the threshold voltage Vth, included in the gate input potential Vin, is cancelled out by the threshold voltage Vth of the readout transistor 42.

As a result, the offset value equivalent to the threshold voltage Vth of the readout transistor 42 is not included in the output potential Vout at the time of the signal readout. Thus, the occurrence of fixed pattern noise attributed to variation in the offset value can be suppressed. In other words, variation in the offset value equivalent to the threshold voltage Vth possessed by the source follower circuit can be corrected by the reset operation by the correction circuit 44A.

[2-2. Embodiment Example 2]
(Pixel Circuit)

Figure 5:
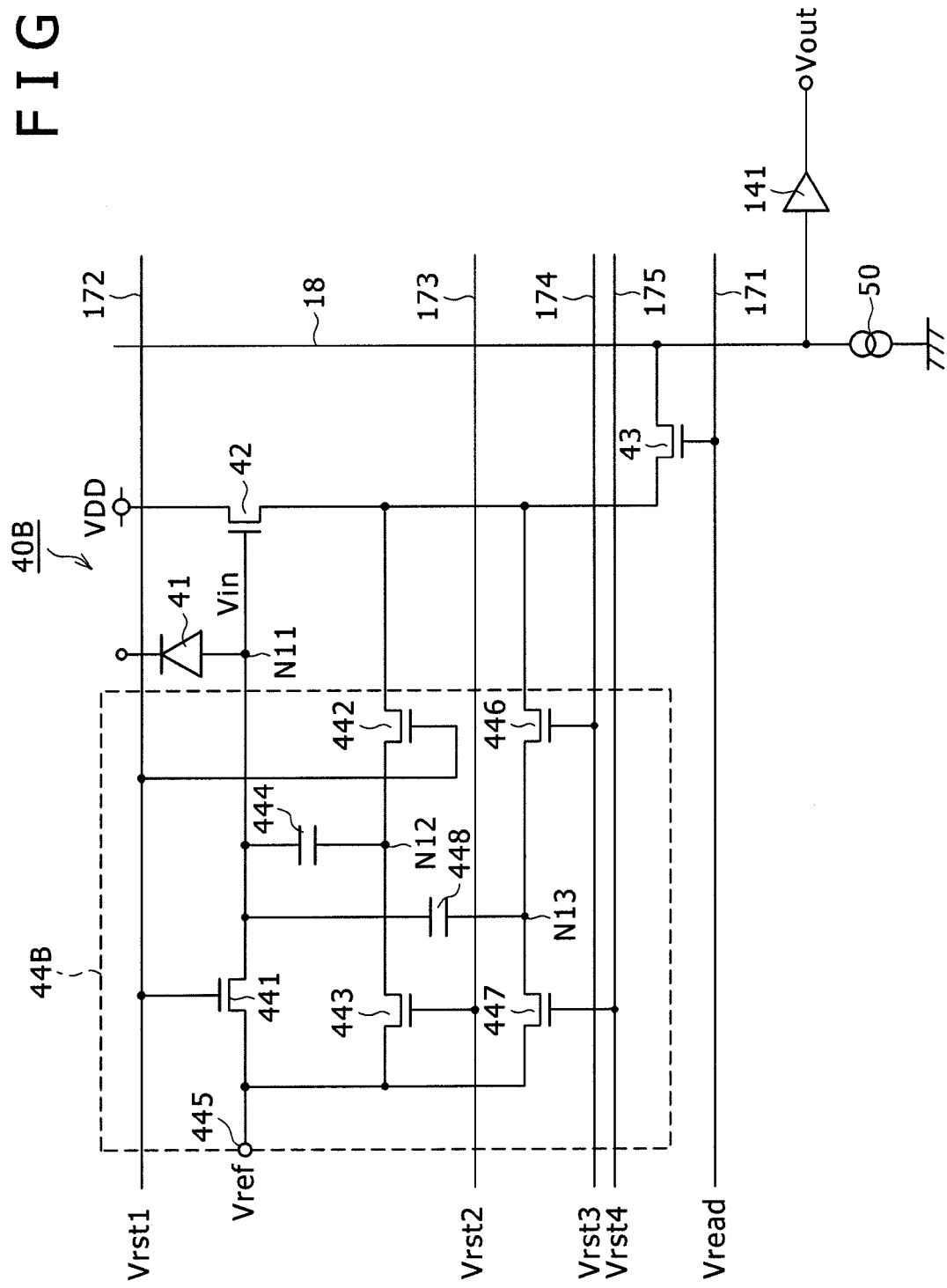
FIG. 5 is a circuit diagram showing the circuit configuration of a unit pixel according to an embodiment example 2.

FIG. 5 is a circuit diagram showing the circuit configuration of a unit pixel according to the embodiment example 2. In FIG. 5, part equivalent to (corresponding to) that in FIG. 3 is given the same numeral, and overlapping description is omitted.

In a unit pixel 40B according to the embodiment example 2, the configuration of a correction circuit 44B provided in each pixel in addition to the photoelectric conversion element 41, the readout transistor 42, and the row selection transistor 43 is different from that of the correction circuit 44A according to the embodiment example 1. The other part is basically the same. For the unit pixel 40B having this correction circuit 44B, as the pixel drive line 17, e.g. five lines, specifically the row selection line 171 and first to fourth reset control lines 172 to 175 are provided for each pixel row.

The correction circuit 44B is composed of five reset transistors 441, 442, 443, 446, and 447 and two capacitors 444 and 448. The reset transistor 441 is connected between the accumulation node N11 and the reference potential terminal (node) 445, and carries out on/off operation in response to the reset signal Vrst1 given from the row scanner 13 via the first reset control line 172. The reference potential Vref is given to the reference potential terminal 445.

One electrode of the reset transistor 442 is connected to the source of the readout transistor 42, and the reset transistor 442 carries out on/off operation in response to the reset signal Vrst1 given from the row scanner 13 via the first reset control line 172. That is, the reset transistor 442 carries out the on/off operation in synchronization with the reset transistor 441.

One electrode of the reset transistor 443 is connected to the other electrode of the reset transistor 442, and the other electrode of the reset transistor 443 is connected to the reference potential terminal 445. The reset transistor 443 carries out on/off operation in response to the reset signal Vrst2 given from the row scanner 13 via the second reset control line 173.

One electrode of the reset transistor 446 is connected to the source of the readout transistor 42 and carries out on/off operation in response to a reset signal Vrst3 given from the row scanner 13 via the third reset control line 174.

One electrode of the reset transistor 447 is connected to the other electrode of the reset transistor 446, and the other electrode of the reset transistor 447 is connected to the reference potential terminal 445. The reset transistor 447 carries out on/off operation in response to a reset signal Vrst4 given from the row scanner 13 via the fourth reset control line 175.

The capacitor 444 is connected between the accumulation node N11 and the common connection node N12 of the reset transistors 442 and 443. The capacitor 448 is connected between the accumulation node N11 and a common connection node N13 of the reset transistors 446 and 447.

In this example, e.g. N-channel field effect transistors are used as the readout transistor 42, the row selection transistor 43, and the reset transistors 441 to 443, 446, and 447. However, this combination of the conductivity type of the readout transistor 42, the row selection transistor 43, and the reset transistors 441 to 443, 446, and 447 is merely one example, and the combination of the conductivity type of these transistors is not limited thereto.

(Circuit Operation)

Figure 6:
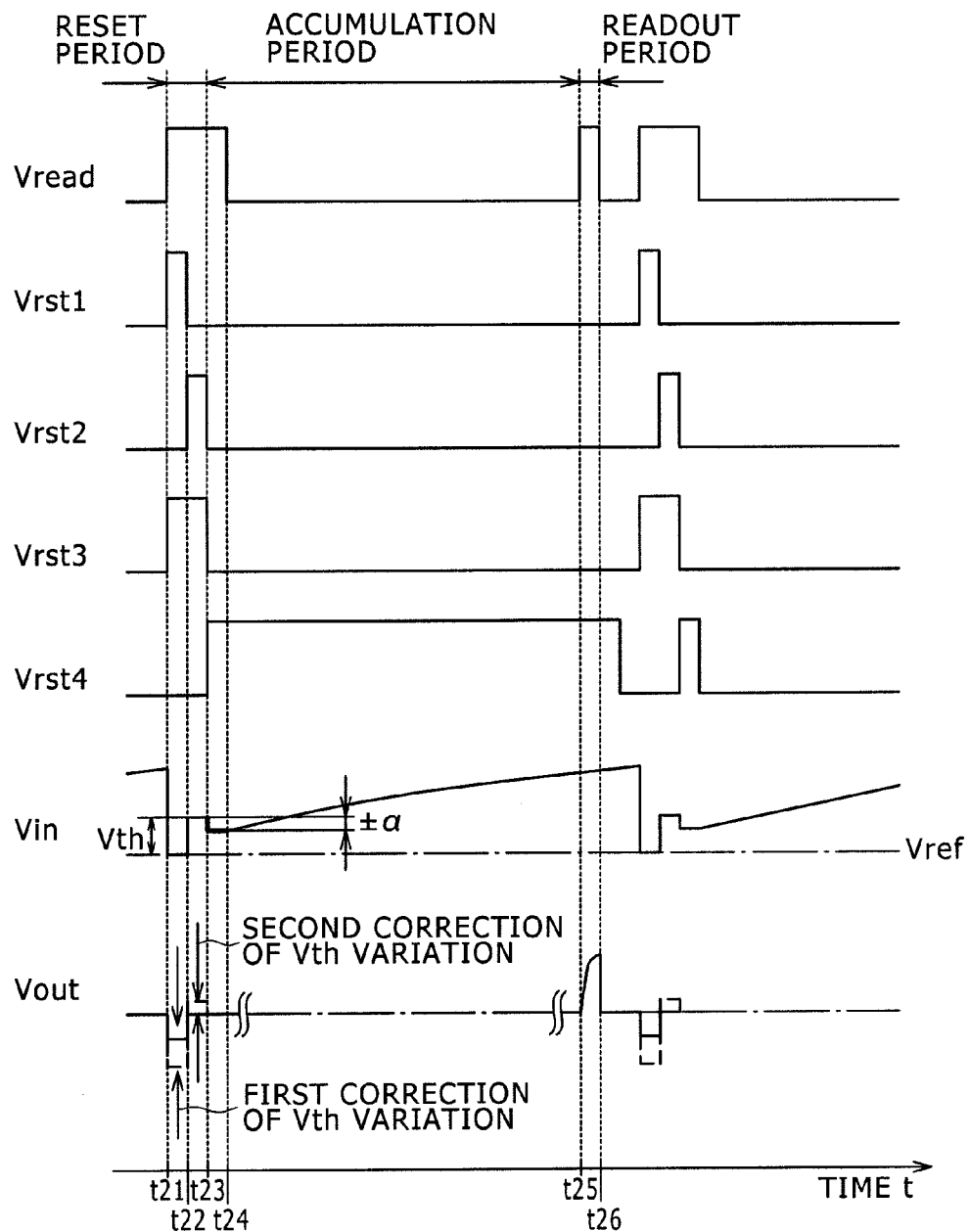
FIG. 6 is a timing chart for explaining the circuit operation of the unit pixel according to the embodiment example 2.

The circuit operation of the unit pixel 40B according to the embodiment example 2 having the above-described configuration will be described below with use of a timing chart of FIG. 6. In the timing chart of FIG. 6, the respective waveforms of the row scan signal Vread, the reset signals Vrst1, Vrst2, Vrst3, and Vrst4, the gate input potential Vin of the readout transistor 42, and the output potential Vout of the amplifier 141 are shown.

At a time t21, the row scan signal Vread becomes the active (in this example, the higher level) state. In response to this, the row selection transistor 43 is turned to the on-state, which leads to the state in which the respective pixels on the pixel row to which the pixel 40B including this row selection transistor 43 belongs are selected.

Simultaneously, at the time t21, both the reset signals Vrst1 and Vrst3 become the active (in this example, the higher level) state, and thereby all of the reset transistors 441, 442, and 446 are turned to the on-state. Due to the switching of the reset transistor 441 to the on-state, the potential of the accumulation node N11 is reset to the reference potential Vref, so that the gate input potential Vin of the readout transistor 42 becomes the reference potential Vref.

At this time, the source potential of the readout transistor 42 becomes the potential lower than the gate input potential Vin by the potential equivalent to the threshold voltage Vth of the readout transistor 42, i.e. Vref−Vth. Furthermore, the potentials of the common connection nodes N12 and N13 also become Vref−Vth because both the reset transistors 442 and 446 are in the on-state.

As a result, the voltage across the capacitor 444 and the voltage across the capacitor 448 become equal to the threshold voltage Vth. The threshold voltage Vth at this time is equal to the threshold voltage of the readout transistor 42 under the operating condition when the gate input potential Vin of the readout transistor 42 is the reference potential Vref.

Next, at a time t22, the reset signal Vrst1 becomes the inactivate state, and simultaneously the reset signal Vrst2 becomes the active (in this example, the higher level) state. Thereby, the reset transistor 443 is turned to the on-state, so that the potential of the common connection node N12 becomes the reference potential Vref. As a result, the potential of the accumulation node N11 is shifted from the potential Vref by the potential equivalent to the voltage Vth across the capacitor 444, to become Vref+Vth.

At this time, the readout transistor 42 is in the operating state when the gate input potential Vin is Vref+Vth. Under this operating condition, if the threshold voltage Vth of the readout transistor 42 involves no variation, the source potential of the readout transistor 42 is the reference potential Vref (=(Vref+Vth)−Vth).

On the other hand, if the threshold voltage Vth of the readout transistor 42 involves variation under the operating condition when the gate input potential Vin is Vref+Vth and the threshold voltage at this time is defined as Vth' (=Vth±α), the source potential of the readout transistor 42 is Vref±α. At this time, the reset signal Vrst3 is in the active state and therefore the reset transistor 446 is still in the on-state. Thus, the voltage across the capacitor 448 becomes Vth±α.

Next, at a time t23, both the reset signals Vrst2 and Vrst3 become the inactivate state, and simultaneously the reset signal Vrst4 becomes the active (in this example, the higher level) state. Thereby, the reset transistor 447 is turned to the on-state, so that the potential of the common connection node N13 becomes the reference potential Vref. As a result, the potential of the accumulation node N11 is shifted from the potential Vref by the potential equivalent to the voltage Vth±α across the capacitor 448, to become Vref+Vth±α.

The period from the time t21 to the time t23, in which the above-described series of operation is carried out, serves as a reset period for resetting the potential of the accumulation node N11. By this reset operation, the potential of the accumulation node N11 becomes Vref+Vth±α. That is, the potential of the accumulation node N11 is reset to Vref+Vth±α. Thereafter, the row scan signal Vread becomes the inactive state at a time t24.

Upon the end of the reset operation at the time t23, accumulation of the signal charge arising from photoelectric conversion by the photoelectric conversion element 41 in the accumulation node N11 is started. Thereby, the gate input potential Vin of the readout transistor 42 rises up from the reference potential Vref+Vth±α depending on the amount of charge accumulated in the accumulation node N11.

Specifically, the accumulation of the signal charge in the accumulation node N11 starts in the state in which the offset value equivalent to the threshold voltage Vth±α of the readout transistor 42 is superimposed on the signal charge due to the reset operation by the reset transistors 441 to 443, 446, and 447. As a result, the gate input potential Vin of the readout transistor 42 is obtained as a potential including the offset value equivalent to the threshold voltage Vth±α.

After the elapse of a certain accumulation period, at a time t25, the row scan signal Vread becomes the active state again. Thereby, the row selection transistor 43 is turned to the on-state, which leads to the state in which the respective pixels on the pixel row to which the pixel 40B including this row selection transistor 43 belongs are selected. The period from the time t23 to the time t25 serves as the accumulation period (photoelectric conversion period).

By the pixel selection, readout of the accumulation voltage by the readout transistor 42 is started. At this time, the offset value included in the gate input potential Vin of the readout transistor 42, i.e. the threshold voltage Vth±α, is cancelled out by the threshold voltage Vth±α of the readout transistor 42. Thus, the output potential Vout is not affected by variation in the threshold voltage Vth±α of the readout transistor 42 in a readout period (t25 to t26) although being affected by the variation in the threshold voltage Vth±α in the reset period (t21 to t23).

The following operation and effect can be achieved by resetting the potential of the accumulation node N11 to Vref+Vth±α prior to signal readout by the reset operation by the correction circuit 44B provided in each pixel 40B as described above.

Specifically, after the reset operation, the signal charge is accumulated in the accumulation node N11 in the state in which the offset value equivalent to the threshold voltage Vth±α of the readout transistor 42 is superimposed on the signal charge. Thus, in signal readout, the offset value included in the gate input potential Vin is cancelled out by the threshold voltage Vth±α of the readout transistor 42.

As a result, the offset value equivalent to the threshold voltage Vth±α of the readout transistor 42 is not included in the output potential Vout at the time of the signal readout. Thus, the occurrence of fixed pattern noise attributed to variation in the offset value can be suppressed. In other words, variation in the offset value equivalent to the threshold voltage Vth±α possessed by the source follower circuit can be corrected by the reset operation by the correction circuit 44B.

In particular, by the correction circuit 44B according to the embodiment example 2, the correction of the variation in the offset value equivalent to the threshold voltage possessed by the source follower circuit is carried out in two stages. Therefore, more accurate correction can be carried out compared with the correction circuit 44A according to the embodiment example 1.

Although the correction of the variation in the offset value of the source follower circuit is carried out in two stages in the above-described example, a correction circuit capable of variation correction in three or more stages can also be realized by increasing the number of circuit elements.

The description of embodiment examples 1 and 2 is made by taking as an example the case in which the reset operation for the correction of the variation in the offset value by the correction circuits 44A and 44B is carried out on each pixel row basis. However, if the variation correction is carried out simultaneously for plural pixel rows, an advantage that the time required for the reset operation can be shortened is achieved.

[2-3. Radiation Detector]

The above description is made on the premise of the photoelectric conversion device 10. In the case of the radiation imaging device 30, a radiation detector (radiation-sensitive unit) that is sensitive to incident radiation and generates a signal charge is used instead of the photoelectric conversion element 41. The radiation detector is roughly categorized into the indirect conversion type radiation detector and the direct conversion type radiation detector. Specific configuration examples of the radiation detector will be described below.

(Indirect Conversion Type Radiation Detector)

Figure 7:
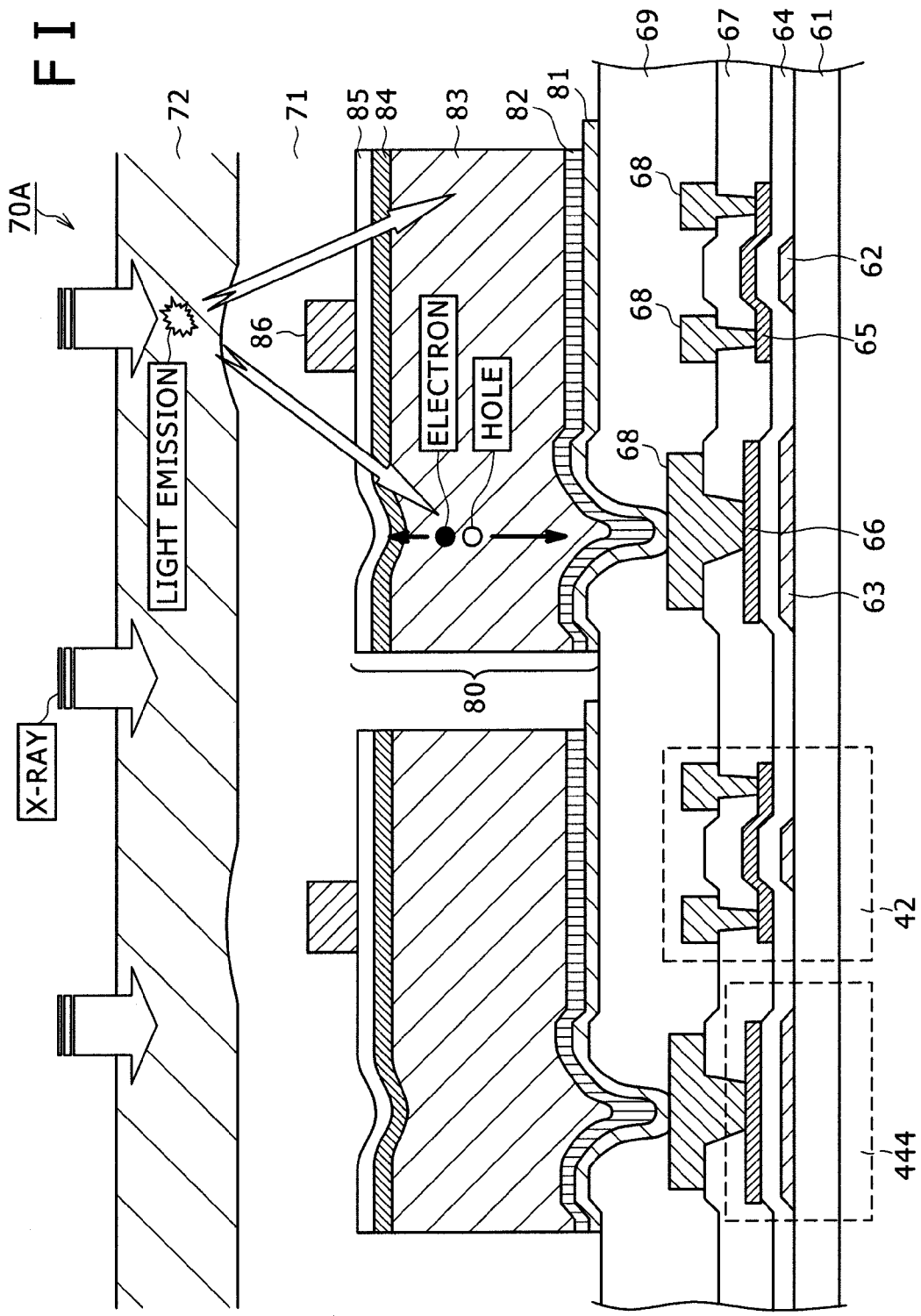
FIG. 7 is a sectional view showing one example of the structure of an indirect conversion type radiation detector.

FIG. 7 is a sectional view showing one example of the structure of an indirect conversion type radiation detector. In this diagram, the element structure of adjacent two pixels is shown together with the circuit part including the readout transistor 42 and the capacitor 444.

Referring to FIG. 7, a gate electrode 62 and a capacitor electrode 63 composed of Ti, Al, Mo, W, Cr, or the like are formed on an insulating substrate 61 such as a glass substrate. A gate insulating film 64 composed of SiNx, SiO$_2$, or the like is formed on these electrodes 62 and 63. A semiconductor layer 65 and a capacitor electrode 66 composed of microcrystalline silicon, polycrystalline silicon, amorphous silicon, or the like are formed on the gate insulating film 64.

A first interlayer insulating film 67 composed of SiNx, SiO$_2$, or the like is formed on the semiconductor layer 65 and the capacitor electrode 66. On the first interlayer insulating film 67, readout signal lines and interconnects 68 for connecting the readout transistor 42 to the capacitor 444 via contact holes are formed by using Ti, Al, Mo, W, Cr, or the like. A second interlayer insulating film 69 composed of SiNx, SiO$_2$, an organic insulating film, or the like is formed on these interconnects 68.

An indirect conversion type radiation detector 70A is formed on the second interlayer insulating film 69. Specifically, on the second interlayer insulating film 69, a lower electrode 81 of a PIN photodiode 80 is formed by using Ti, Al, Mo, W, Cr, or the like with the intermediary of a contact hole. On the lower electrode 81, a p-type semiconductor layer 82, an i-type semiconductor layer 83, and an n-type semiconductor layer 84 are sequentially stacked, and thereby the so-called PIN photodiode 80 is formed.

As the semiconductor layers of this PIN photodiode 80, amorphous silicon, microcrystalline silicon, polycrystalline silicon, or the like can be used. Furthermore, a material such as germanium or carbon may be introduced into any of these kinds of silicon to thereby change the spectral sensitivity. In addition, as the PIN photodiode 80, one having the opposite configuration, i.e. one whose lower side is the n-type semiconductor and upper side is the p-type semiconductor, may be employed.

On the n-type semiconductor layer 84, an upper electrode 85 for applying the prescribed voltage to the PIN photodiode 80 is formed by using a transparent electrically-conductive film of indium tin oxide (ITO) or the like. Moreover, a power supply line 86 for supplying voltage to the upper electrode 85 is formed on the upper electrode 85 by using Ti, Al, Mo, W, Cr, or the like.

A planarizing film 71 is formed on the PIN photodiode 80 by using an organic planarizing film, a spin-on-glass material, or the like. On the planarizing film 71, a phosphor 72 referred to as a so-called scintillator, for converting radiation such as X-rays to visible light, is formed by using CsI, NaI, $CaF_2$, or the like.

The phosphor 72 is a wavelength converter that performs wavelength conversion of radiation such as X-rays into the sensitivity range of the PIN photodiode 80. A protective film (not shown) may be formed on the phosphor 72 by using amorphous carbon, Al, or the like according to need.

The indirect conversion type radiation detector 70A having the above-described configuration is used with application of such a voltage (e.g. about 3 to 10 V) to the upper electrode 85 of the PIN photodiode 80 that the PIN photodiode 80 is reverse biased due to the potential difference between the upper electrode 85 and the lower electrode 81. Depending on the case, it may be used with e.g. reset operation through application of a forward bias voltage.

(Direct Conversion Type Radiation Detector)

Figure 8:
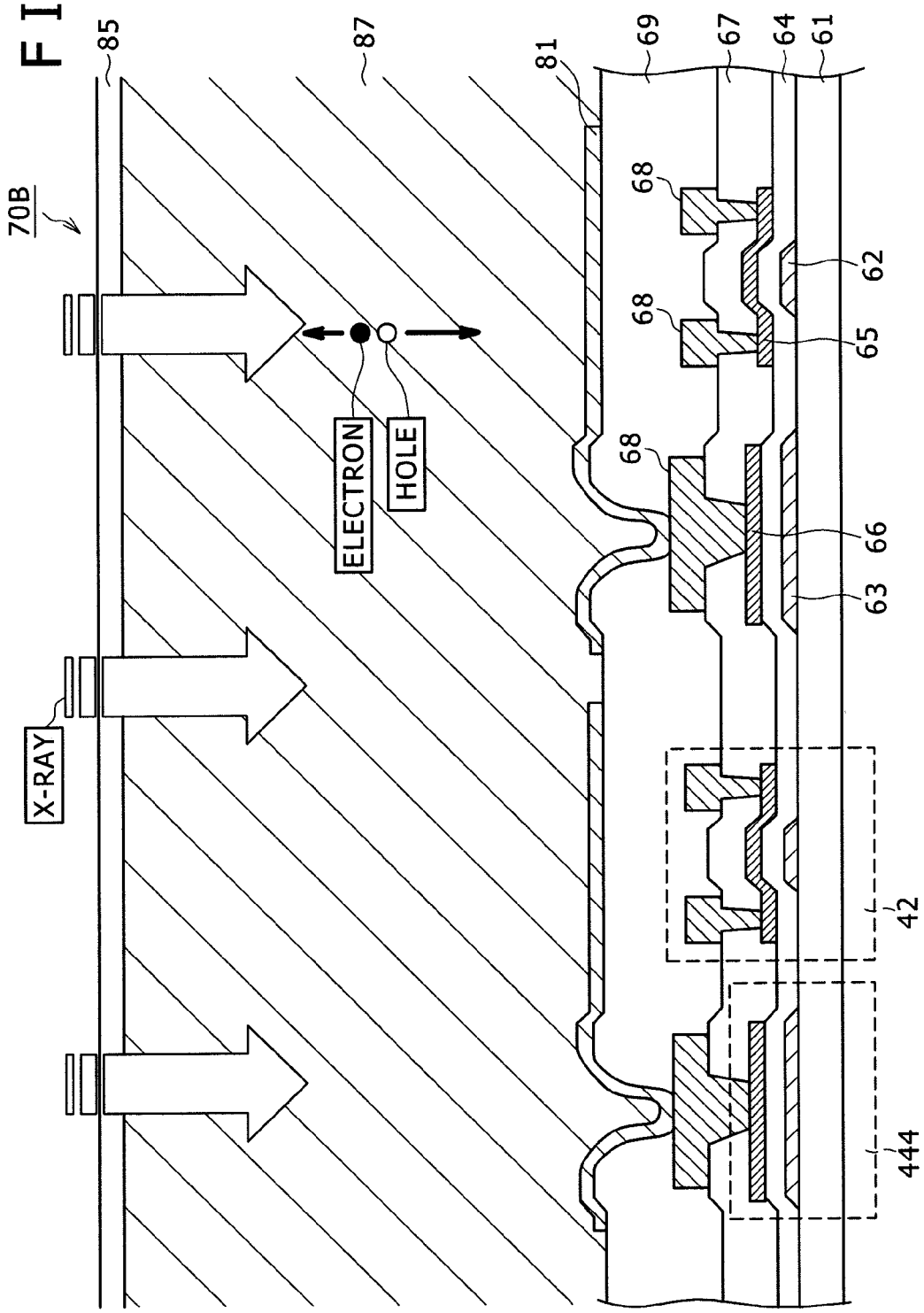
FIG. 8 is a sectional view showing one example of the structure of a direct conversion type radiation detector.

FIG. 8 is a sectional view showing one example of the structure of a direct conversion type radiation detector. In FIG. 8, part equivalent to (corresponding to) that in FIG. 7 is given the same numeral, and overlapping description is omitted. Also in this diagram, the element structure of adjacent two pixels is shown together with the circuit part including the readout transistor 42 and the capacitor 444.

In this direct conversion type radiation detector 70B, the configuration from the gate electrode 62 to the lower electrode 81 is the same as that in the indirect conversion type radiation detector 70A. Therefore, the description thereof is omitted. The direct conversion type radiation detector 70B has a configuration in which an X-ray charge conversion film 87 that directly converts X-rays to a charge is formed on the lower electrode 81 by using Se, $PbI_2$, PbTe, HgTe, $HgI_2$, ZnS, ZnTe, GaP, AlSb, CdZnTe, CdTe, CdSe, CdS, or the like. Depending on the case, a PIN structure may be constructed by forming an n-type layer and a p-type layer on and under the X-ray charge conversion film 87 in order to prevent injection of an unnecessary charge.

On the X-ray charge conversion film 87, the upper electrode 85 for applying a proper voltage to this X-ray charge conversion film 87 is formed by using Ti, Al, Mo, W, Cr, or the like. In general, the X-ray charge conversion film 87 is formed with a film thickness of about 100 μm to 1000 μm. Therefore, a high voltage of about 1 kV should be applied to the upper electrode 85.

Although a bottom-gate structure is employed as the structure of the transistor part in the above-described indirect conversion type radiation detector 70A and direct conversion type radiation detector 70B, the transistor part may have a top-gate structure.

Figure 9:
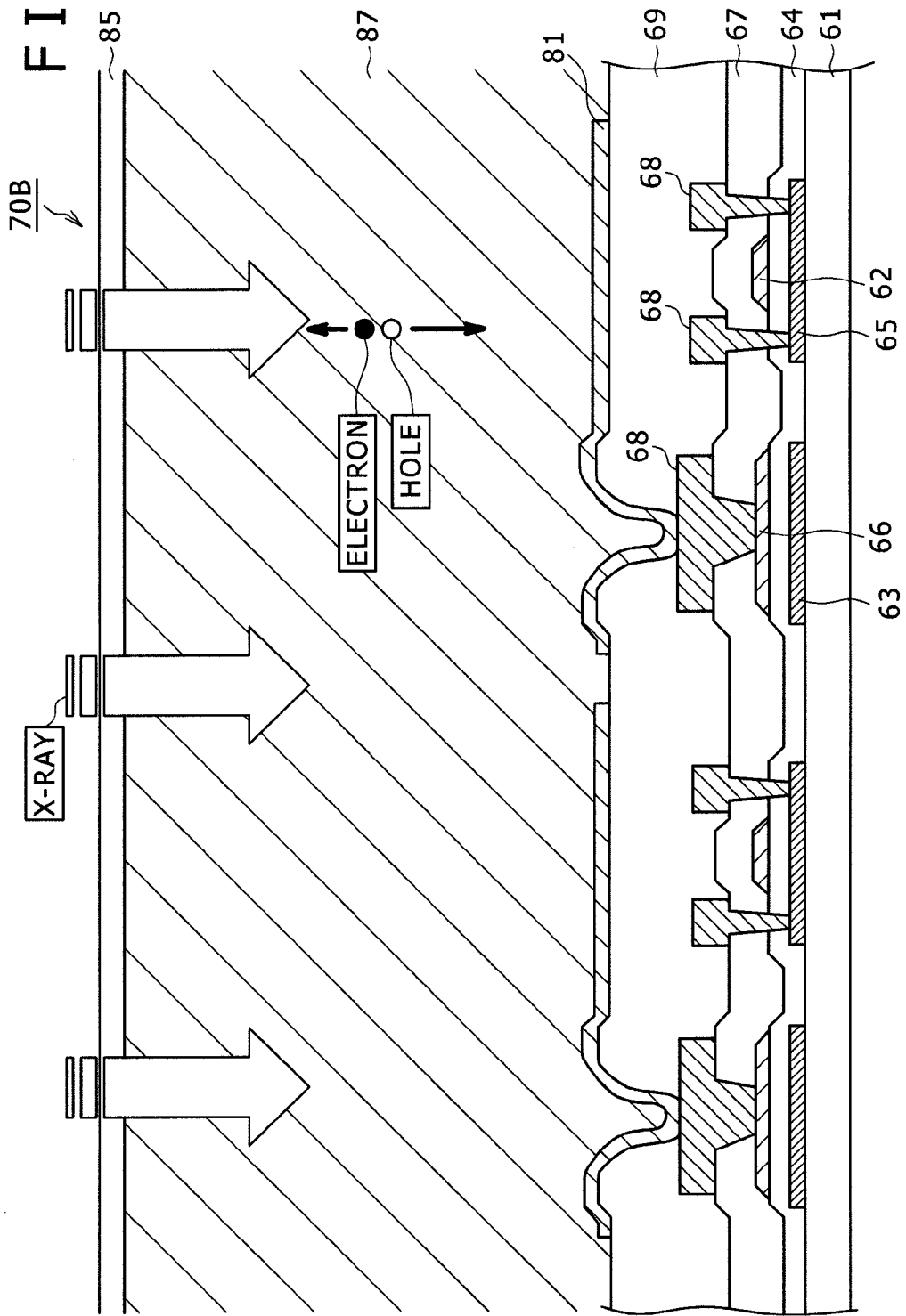
FIG. 9 is a sectional view showing the structure of the direct conversion type radiation detector when a top-gate structure is employed as the structure of a transistor part.

FIG. 9 shows the structure of the direct conversion type radiation detector 70B when a top-gate structure is employed as the structure of the transistor part. In FIG. 9, part equivalent to that in FIG. 8 is given the same numeral, and overlapping description is omitted. Although the direct conversion type radiation detector 70B is shown here as the radiation detector including the top-gate structure, the same applies also to the indirect conversion type radiation detector 70A.

In the case of the top-gate structure, the semiconductor layer 65 composed of microcrystalline silicon, polycrystalline silicon, amorphous silicon, or the like is formed on the insulating substrate 61 such as a glass substrate, and the gate insulating film 64 composed of SiNx, $SiO_2$, or the like is formed on the semiconductor layer 65. Furthermore, the gate electrode 62 composed of Ti, Al, Mo, W, Cr, or the like is formed on the gate insulating film 64.

Although detailed description of the transistor part is omitted in the above examples, it is effective to form a lightly doped drain (LDD) between the channel part and the source/drain in order to reduce leakage current.

[2-4. Radiation Imaging Device]

By using the radiation detector 70 (indirect conversion type radiation detector 70A/direct conversion type radiation detector 70B) having the above-described configuration instead of the photoelectric conversion element 41 of FIG. 3 and FIG. 5, a radiation imaging device (the radiation imaging device 30 of FIG. 2) that reads information based on radiation can be formed. This radiation imaging device 30 can perform wavelength conversion of radiation typified by α-rays, β-rays, γ-rays, and X-rays into the sensitivity range of the photoelectric conversion device 10 and read information based on the radiation.

In this radiation imaging device 30, the offset value equivalent to the threshold voltage possessed by the source follower circuit changes every time imaging is performed due to the influence of the use temperature of the radiation imaging device 30, the residual signal values attributed to the previous radiation irradiation, aging deterioration accompanying use for a long period, and so forth. This offset value can be excluded by the correction circuit 44 (44A and 44B). Furthermore, because readout of the correction values for every imaging is unnecessary, high-speed photographing such as dynamic photographing of a heart or the like is allowed. Thus, the exposure of the human body to radiation can be reduced.

<3. Modification Examples>

The above-described embodiment employs a configuration in which the peripheral circuit part including the row scanner 13 for driving the pixels is provided on the same substrate 11 as that of the pixel array unit 12. However, it is also possible to employ a configuration in which the peripheral circuit part is provided outside the substrate 11.

However, it is more advantageous to employ a configuration in which e.g. the row scanner 13 is provided on the substrate 11 in terms of the following point. For example, variation in the synchronization among plural drive ICs, which occurs when timing control is carried out from the drive ICs provided outside the substrate 11, does not occur, and thus a system for controlling the synchronization among the drive ICs and adjustment operation for the system are unnecessary. Furthermore, operation of connecting the plural drive ICs to the substrate 11 is unnecessary, and therefore large cost reduction is possible.

Furthermore, in the case of a portable radiation imaging device, the possibility of line breaking due to e.g. vibration when the radiation imaging device is being carried is decreased, and thus the reliability can be greatly enhanced. Moreover, compared with the case of connecting the plural drive ICs to the substrate 11 by a flexible cable or the like, the size reduction of the device main body can be achieved, which leads to an advantage that the flexibility in incorporation in the device main body is greatly enhanced.

In the above-described embodiment, the respective unit pixels 40 (40A and 40B) in the pixel array unit 12 are driven by one row scanner 13. However, the driver of the unit pixels is not limited to one row scanner 13.

Figure 10:
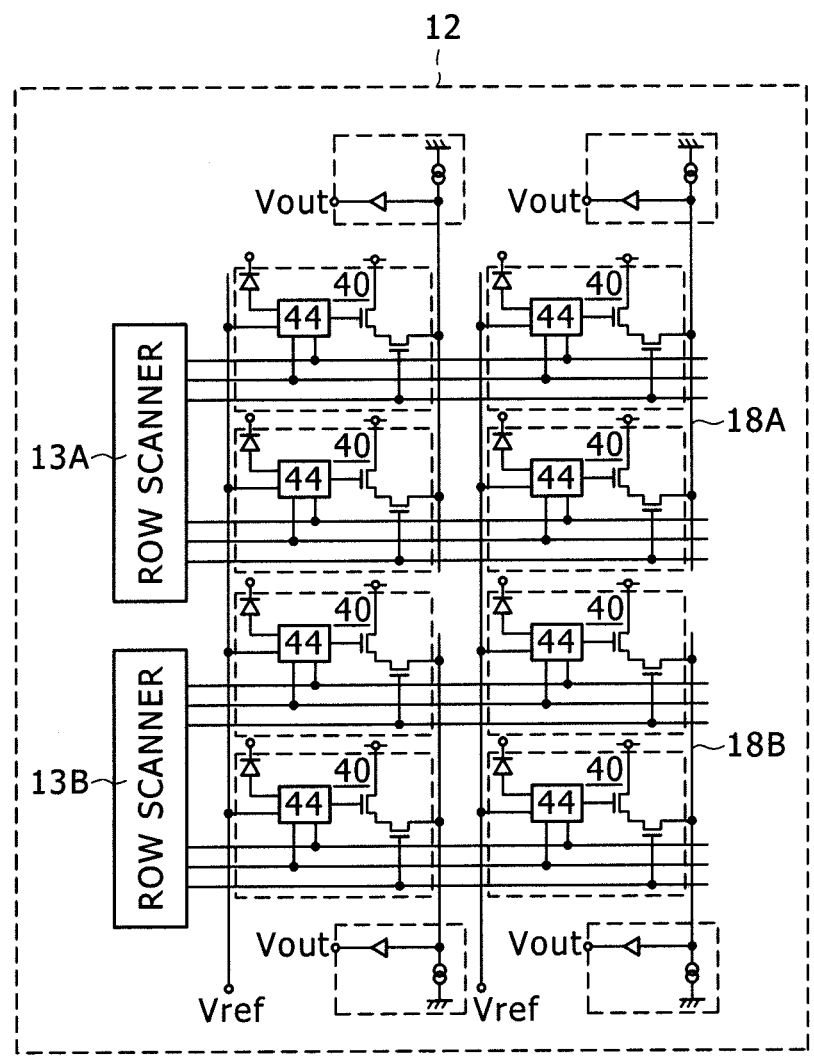
FIG. 10 is a configuration diagram showing the configuration of a pixel array unit according to modification example 1.

For example, as shown in FIG. 10, it is also possible to employ a configuration in which the vertical signal line 18 is divided into upper and lower vertical signal lines 18A and 18B and the row scanner 13 is divided into upper and lower row scanners 13A and 13B by which the pixels are driven in parallel.

In the configuration in which two vertical signal lines 18 are provided for one pixel column in this manner, simultaneous resetting for two rows by the correction circuit 44 is possible. Furthermore, signal readout from the unit pixel 40 can also be carried out in parallel via the vertical signal lines 18A and 18B. Thus, the signal readout speed can be increased to at least twice that in the driving by one row scanner 13.

Figure 11:
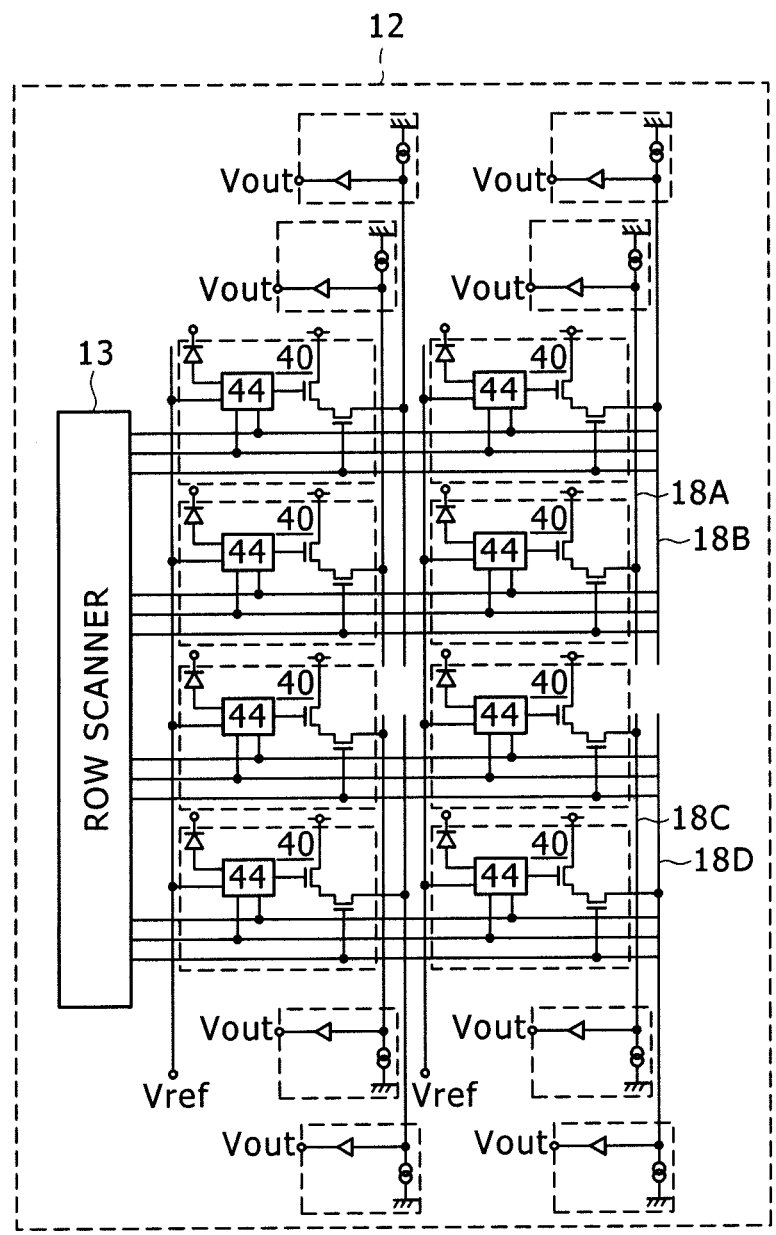
FIG. 11 is a configuration diagram showing the configuration of a pixel array unit according to modification example 2.

Although two vertical signal lines 18 are provided for one pixel column in the configuration of the modification example 1 of FIG. 10, the number of vertical signal lines 18 per one pixel column is not limited to two. For example, as shown in FIG. 11, it is also possible to employ a configuration in which two vertical signal lines 18A and 18B are provided on the upper side of the pixel array unit 12 and two vertical signal lines 18C and 18D are provided on the lower side, i.e. total four lines are provided.

In the configuration in which four vertical signal lines 18 are provided for one pixel column in this manner, the speed of the reset operation and the signal readout operation can be increased to twice that when two lines are provided. Although two or four vertical signal lines 18 are provided for one pixel column in the above examples, it is also possible to employ a configuration in which three or five or more lines are provided, and the speed of the reset operation and the signal readout operation can be further enhanced.

Moreover, it is preferable to carry out the reset operation by the correction circuit 44 simultaneously for plural pixel rows as long as the driving capability of the constant current source 50 (see FIG. 3 and FIG. 5) for signal readout permits. By simultaneously resetting plural pixel rows, the time required for the reset operation is shortened compared with the case in which the reset operation is sequentially carried out on each pixel row basis. As the number of pixel rows of the simultaneous reset operation increases, the time is further shortened, and thus readout at higher speed is allowed.

Figure 12:
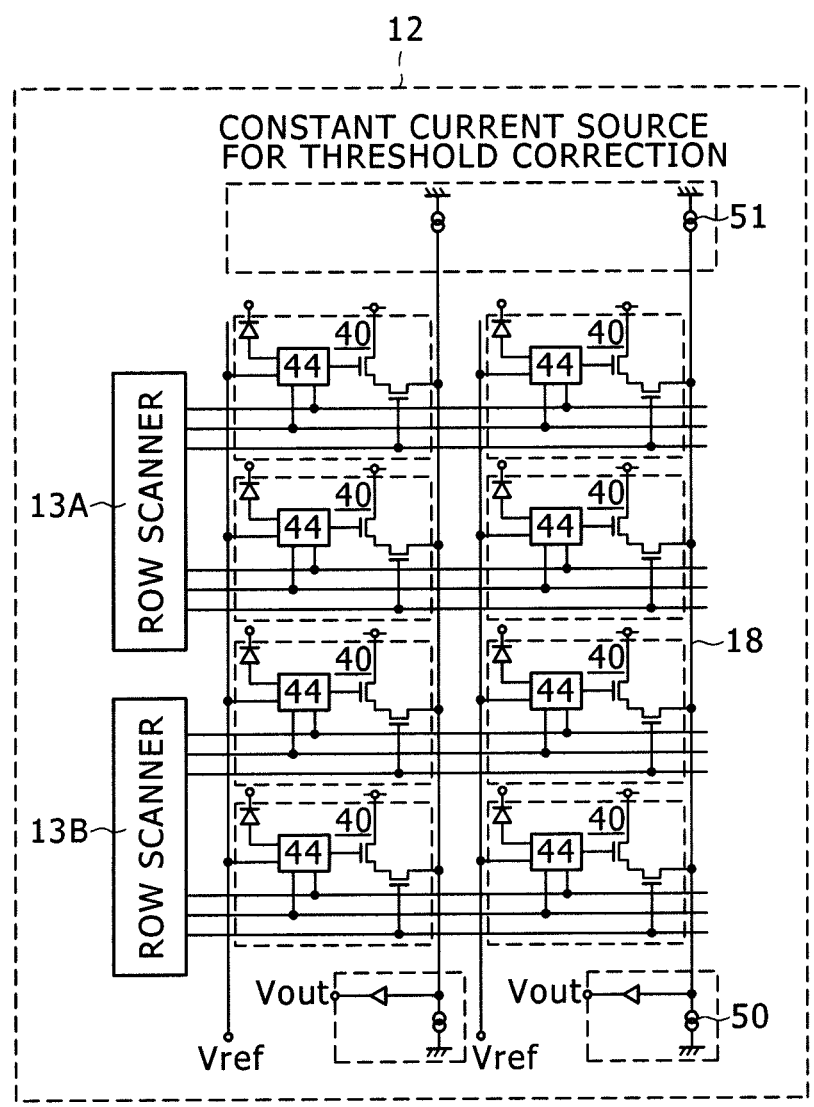
FIG. 12 is a configuration diagram showing the configuration of a pixel array unit according to modification example 3.
Figure 13:
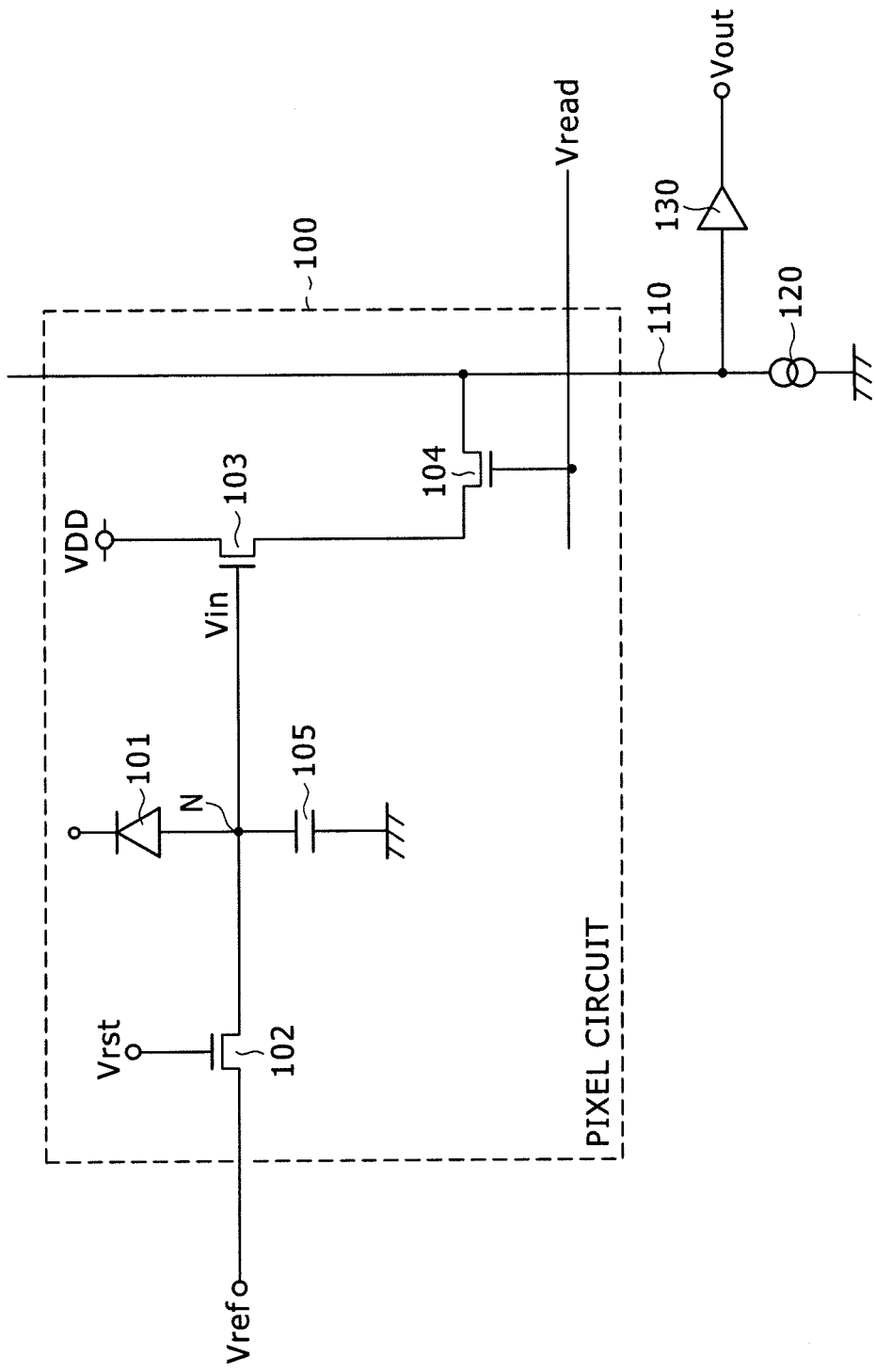
FIG. 13 is a circuit diagram showing a related-art pixel circuit including a source follower circuit.

Furthermore, as shown in FIG. 12, it is also possible to employ a configuration in which a constant current source 51 whose driving capability is higher than that of the constant current source 50 is provided for threshold correction resetting at the other end side of the vertical signal line 18, whose one end side is connected to the constant current source 50 for signal readout, and this constant current source 51 is used at the time of the reset operation. By this configuration, the reset operation for threshold correction can be carried out more surely compared with the case in which the reset operation is carried out by using the constant current source 50 for signal readout.

The present application contains subject matter related to that disclosed in Japanese Priority Patent Application JP 2009-151845 filed in the Japan Patent Office on Jun. 26, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion device having unit pixels arranged in a matrix, each of the unit pixels comprising:
   a photoelectric conversion element;
   a source follower readout transistor configured to receive a signal charge arising from photoelectric conversion by the photoelectric conversion element at its gate, and read out an electrical signal dependent on the signal charge; and
   a correction circuit configured to reset a gate potential of the readout transistor to Vref+Vth prior to signal readout by the readout transistor, wherein a reference potential that is applied to the gate of the readout transistor is Vref and a threshold voltage of the readout transistor is Vth.

2. The photoelectric conversion device according to claim 1, wherein
   the correction circuit has a capacitor that is disposed between the gate and a source of the readout transistor and is connected to the source via a switch element, and
   the correction circuit resets the gate potential of the readout transistor by controlling connection/non-connection between the capacitor and the source by the switch element prior to signal readout by the readout transistor.

3. The photoelectric conversion device according to claim 1, wherein
   the readout transistor includes a semiconductor layer composed of microcrystalline silicon or polycrystalline silicon.

4. The photoelectric conversion device according to claim 1, wherein
   the correction circuit has:
   a first transistor that is connected between a node of the reference potential and the gate of the readout transistor and gives the reference potential to the gate of the readout transistor;
   a second transistor that has one electrode connected to a source of the readout transistor and carries out on/off operation in synchronization with the first transistor;
   a capacitor that has one terminal connected to the gate of the readout transistor and the other terminal connected to the other electrode of the second transistor; and
   a third transistor that is connected between the node of the reference potential and the other electrode of the second transistor, and gives the reference potential to the other terminal of the capacitor after the first and second transistors are turned off.

5. The photoelectric conversion device according to claim 4, wherein
   the correction circuit has a circuit configuration capable of carrying out operation of resetting the gate potential of the readout transistor a plurality of times.

6. The photoelectric conversion device according to claim 1, wherein
   a driver that drives the unit pixels and drives transistors in the correction circuits is formed on the same substrate as a substrate of the unit pixels.

7. The photoelectric conversion device according to claim 6, wherein
   the driver drives the transistors in the correction circuits simultaneously for a plurality of pixel rows of the matrix arrangement of the unit pixels.

8. The photoelectric conversion device according to claim 7, wherein
   at least two signal lines to which an electrical signal is read out by the readout transistor are provided for one pixel column of the matrix arrangement of the unit pixels.

9. A method for driving a photoelectric conversion device having unit pixels arranged in a matrix, each of the unit pixels including a photoelectric conversion element and a source follower readout transistor that receives a signal charge arising from photoelectric conversion by the photoelectric conversion element by a gate and reads out an electrical signal dependent on the signal charge, the method comprising:

resetting a gate potential of the readout transistor to Vref+Vth prior to signal readout by the readout transistor, wherein a reference potential that is applied to the gate of the readout transistor is Vref and a threshold voltage of the readout transistor is Vth.

10. A radiation imaging device having unit pixels arranged in a matrix, each of the unit pixels comprising:

a radiation detector that receives incident radiation and generates a corresponding signal charge;

a source follower readout transistor configured to receive a signal charge generated by the radiation detector at its gate, and read out an electrical signal dependent on the signal charge; and a correction circuit configured to reset a gate potential of the readout transistor to Vref+Vth prior to signal readout by the readout transistor, wherein a reference potential that is applied to the gate of the readout transistor is Vref and a threshold voltage of the readout transistor is Vth.

11. A method for driving a radiation imaging device having unit pixels arranged in a matrix, each of the unit pixels including a radiation detector that is sensitive to incident radiation and generates a signal charge, and a source follower readout transistor that receives a signal charge generated by the radiation detector by a gate and reads out an electrical signal dependent on the signal charge, the method comprising:

resetting a gate potential of the readout transistor to Vref+Vth prior to signal readout by the readout transistor, wherein a reference potential that is applied to the gate of the readout transistor is Vref and a threshold voltage of the readout transistor is Vth.

* * * * *